US009292210B1

(12) United States Patent
Campbell et al.

(10) Patent No.: US 9,292,210 B1
(45) Date of Patent: Mar. 22, 2016

(54) THERMALLY SENSITIVE WEAR LEVELING FOR A FLASH MEMORY DEVICE THAT INCLUDES A PLURALITY OF FLASH MEMORY MODULES (71) Applicant: International Business Machines Corporation, Armonk, NY (US)

(72) Inventors: Keith M. Campbell, Cary, NC (US); William M. Megarity, Raleigh, NC (US); Luke D. Remis, Raleigh, NC (US); Gregory D. Sellman, Morrisville, NC (US); Christopher L. Wood, Greenville, NC (US)

(73) Assignee: International Business Machines Corporation, Armonk, NY (US)

( * ) Notice: Subject to any disclaimer, the term of this patent is extended or adjusted under 35 U.S.C. 154(b) by 36 days.

(21) Appl. No.: 14/473,121

(22) Filed: Aug. 29, 2014

(51) Int. Cl.
G06F 12/02 (2006.01)
G06F 3/06 (2006.01)
G11C 16/34 (2006.01)

(52) U.S. Cl.
CPC ............ *G06F 3/0616* (2013.01); *G06F 3/0644* (2013.01); *G06F 3/0653* (2013.01); *G06F 3/0679* (2013.01); *G11C 16/3495* (2013.01)

(58) Field of Classification Search
CPC ... G06F 3/0616; G06F 3/0644; G06F 3/0653; G06F 3/0679; G11C 16/3495
See application file for complete search history.

(56) References Cited

U.S. PATENT DOCUMENTS 9,086,954 B2 * 7/2015 Yeh ..................... G06F 12/0246
711/103
2006/0111866 A1 5/2006 LeClerg et al.
2006/0236027 A1 10/2006 Sandeep et al.
2009/0160569 A1 6/2009 Gros
2010/0115186 A1 5/2010 Chang et al.
(Continued)

FOREIGN PATENT DOCUMENTS

JP 02008146255 A 6/2008
JP 02011103077 A 5/2011
JP 02012174331 A 9/2012

OTHER PUBLICATIONS

Kwon et al., "Hot-LSNs Distributing Wear-Leveling Algorithm for Flash Memory", ACM Transactions on Embedded Computing Systems, vol. 12, No. 1s, Article 62, Publication date: Mar. 2013, 28 pages, ACM New York, NY, USA.

(Continued)

*Primary Examiner* — Hiep Nguyen
(74) *Attorney, Agent, or Firm* — Edward J. Lenart; James R. Nock; Kennedy Lenart Spraggins LLP (57) ABSTRACT Thermally sensitive wear leveling for a flash memory device that includes a plurality of flash memory modules, the flash memory device included in a computing system that includes a plurality of additional computing components, including: identifying a thermal sensitivity coefficient for each flash memory module in dependence upon a physical topology of the flash memory device and one or more of the additional computing components; identifying wear leveling information for each flash memory module; receiving a request to write data to the flash memory device; selecting, in dependence upon the thermal sensitivity coefficient for each flash memory module and the wear leveling information for each flash memory module, a target flash memory module for servicing the request to write data to the flash memory device; and writing the data to the target flash memory module.

20 Claims, 4 Drawing Sheets (56) References Cited

U.S. PATENT DOCUMENTS

| | | | |
|---|---|---|---|
| 2010/0325340 A1* | 12/2010 | Feldman et al. | G06F 12/0246 711/103 |
| 2010/0325353 A1 | 12/2010 | Kim | |
| 2011/0047421 A1* | 2/2011 | Schuette | G11C 16/349 714/718 |
| 2011/0131367 A1 | 6/2011 | Park et al. | |
| 2012/0096234 A1 | 4/2012 | Jiang et al. | |
| 2012/0278650 A1* | 11/2012 | Muralimanohar et al. | G06F 11/004 714/6.1 |
| 2012/0331207 A1 | 12/2012 | Lassa et al. | |
| 2013/0117497 A1 | 5/2013 | CUI et al. | |
| 2013/0329352 A1* | 12/2013 | Nigen et al. | H05K 7/205 361/679.31 |
| 2015/0178190 A1* | 6/2015 | Fisher et al. | G06F 12/0246 711/103 |
| 2015/0199268 A1* | 7/2015 | Davis et al. | G06F 12/0246 711/103 |

OTHER PUBLICATIONS

Zhang et al., "Exploring Phase Change Memory and 3D Die-Stacking for Power/Thermal Friendly, Fast and Durable Memory Architectures", 18th International Conference on Parallel Architectures and Compilation Techniques (PACT '09), Sep. 2009, pp. 101-112, IEEE Xplore Digital Library (online), USA, DOI: 10.1109/PACT.2009.30.

Shrestha et al., "A Quantitative Framework for Modeling and Analyzing Flash Memory Wear Leveling Algorithms", IEEE Globecom 2010 Workshop on Application of Communication Theory to Emerging Memory Technologies, Dec. 2010, pp. 1836-1840, IEEE Xplore Digital Library (online), USA, DOI: 10.1109/GLOCOMW.2010.5700259.

Lin et al., "Thermal Modeling and Management of DRAM Memory Systems", Proceedings of the 34th annual International Symposium on Computer Architecture (ISCA'07), May 2007, pp. 312-322, vol. 35, Issue 2, ACM New York, NY, USA.

Reactive Data, "Introducing SATA 6Gb/s High Performance, Reliable, and Low Power for an Enhanced User Experience", reactivedata.com (online), retrieved Apr. 17, 2014, 1 page, URL: http://www.reactivedata.com/Products/SanDisk_Industrial_and_Enterprise/Industrial_Embedded_SSD/Solid_State_Drives/SanDisk_X110_SSD/index.php.

Cudak, et al., U.S. Appl. No. 13/791,068, filed Mar. 8, 2013, pp. 1-33.

Liu et al. "A Wear Leveling Algorithm Based on Temperature of the Logic Block and Age of the Physical Block", Computer Systems & Applications, Dec. 2011, (English abstract only), 2 pages, China National Knowledge Infrastructure—cnki.com.cn (online), URL: http://en.cnki.com.cn/Article_en/CJFDTOTAL-XTYY201112027.htm.

\* cited by examiner

THERMALLY SENSITIVE WEAR LEVELING FOR A FLASH MEMORY DEVICE THAT INCLUDES A PLURALITY OF FLASH MEMORY MODULES

BACKGROUND OF THE INVENTION

1. Field of the Invention

The field of the invention is data processing, or, more specifically, methods, apparatus, and products for thermally sensitive wear leveling for a flash memory device that includes a plurality of flash memory modules.

2. Description of Related Art

Modern computing devices can include storage devices that utilized flash-based memory. The performance of such flash-based memory, however, is only guaranteed to be reliable when the flash-based memory is at a temperature that is below and predetermined threshold. In addition, the performance of such flash-based memory is also only guaranteed to be reliable when the flash-based memory has been written to less than a predetermined number of times.

SUMMARY OF THE INVENTION

Methods, apparatuses, and products for thermally sensitive wear leveling for a flash memory device that includes a plurality of flash memory modules, the flash memory device included in a computing system that includes a plurality of additional computing components, including: identifying a thermal sensitivity coefficient for each flash memory module in dependence upon a physical topology of the flash memory device and one or more of the additional computing components; identifying wear leveling information for each flash memory module; receiving a request to write data to the flash memory device; selecting, in dependence upon the thermal sensitivity coefficient for each flash memory module and the wear leveling information for each flash memory module, a target flash memory module for servicing the request to write data to the flash memory device; and writing the data to the target flash memory module.

The foregoing and other objects, features and advantages of the invention will be apparent from the following more particular descriptions of example embodiments of the invention as illustrated in the accompanying drawings wherein like reference numbers generally represent like parts of example embodiments of the invention.

DETAILED DESCRIPTION OF EXAMPLE EMBODIMENTS

Figure 1:
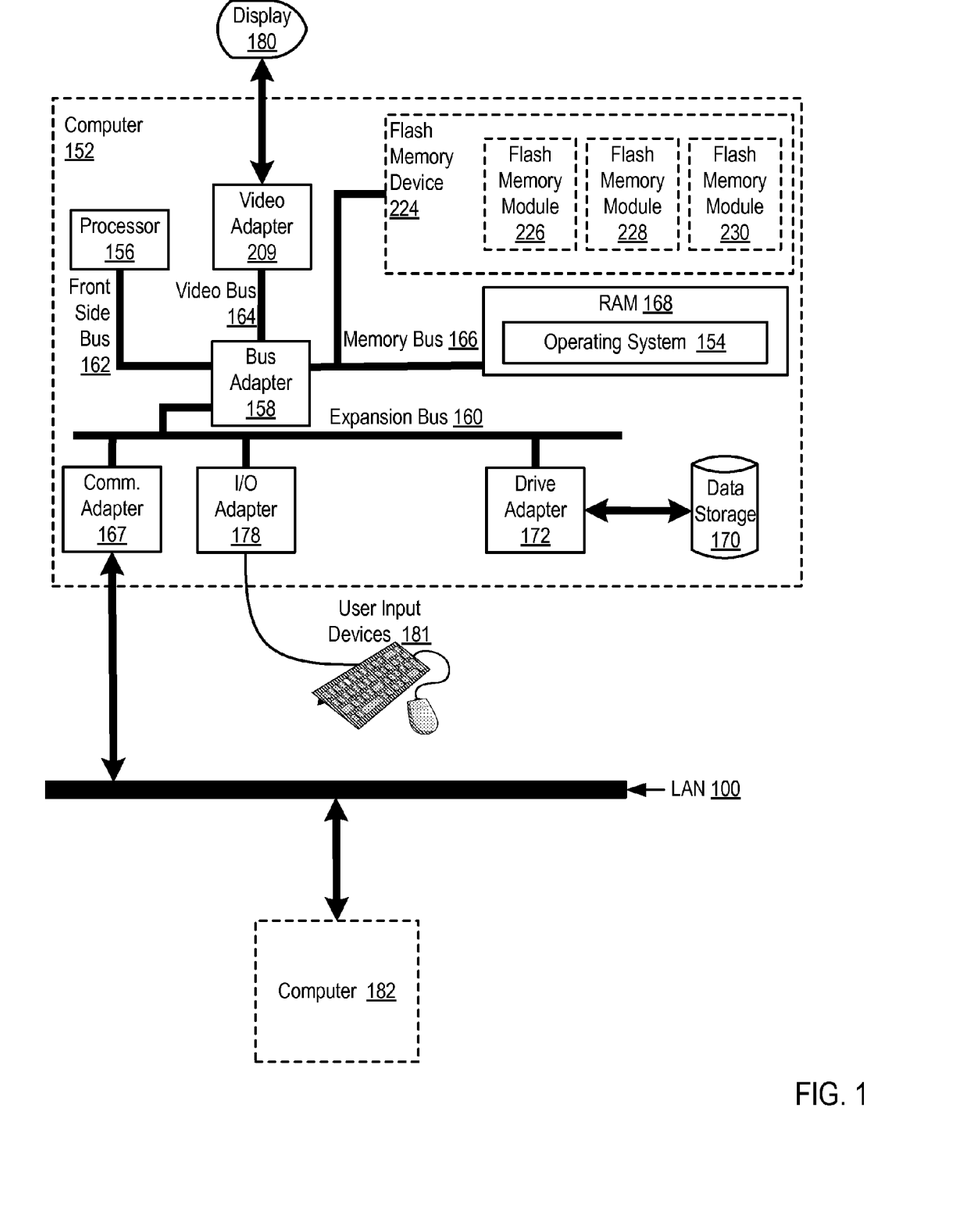
FIG. 1 sets forth a block diagram of automated computing machinery comprising an example computer useful in thermally sensitive wear leveling for a flash memory device that includes a plurality of flash memory modules according to embodiments of the present invention.

Example methods, apparatuses, and products for thermally sensitive wear leveling for a flash memory device in accordance with the present invention are described with reference to the accompanying drawings, beginning with FIG. 1. FIG. 1 sets forth a block diagram of automated computing machinery comprising an example computer (152) useful in thermally sensitive wear leveling for a flash memory device (224) according to embodiments of the present invention.

The computer (152) of FIG. 1 includes a flash memory device (224) that includes a plurality of flash memory modules (226, 228, 230) according to embodiments of the present invention. The flash memory device (224) is a form of computer storage that utilizes flash-based memory to form non-volatile computer storage. The flash memory device (224) may be embodied, for example, as a flash dual in-line memory module ('DIMM') where flash-based memory is packaged onto a DIMM form factor that is inserted into a DIMM slot, as Peripheral Component Interconnect Express ('PCIe') flash device where flash-based memory is packaged onto a PCIe expansion card form factor that is inserted into a PCIe slot, and so on. Such flash memory devices (224) may therefore provide non-volatile memory to the computer (152) in form factors that are distinct from traditional forms of non-volatile memory such as a traditional hard disk drive.

The flash memory device (224) depicted in FIG. 1 includes a plurality of flash memory modules (226, 228, 230). Each flash memory modules (226, 228, 230) may be embodied, for example, as a flash chip. Each flash memory module (226, 228, 230) may be arrayed to achieve a total capacity for the flash memory device (224) that is equal to the sum of the memory capacity for each of the flash memory modules (226, 228, 230).

The flash memory device (224) depicted in FIG. 1 is included in a computer (152) that includes a plurality of additional computing components. The additional computing components of interest may include any computing component that thermally impacts the flash memory device (224) and the flash memory modules (226, 228, 230) contained therein. One example of an additional computing component is a fan that draws cooler air into the case of the computer (152) from the outside, expels warm air from inside the case of the computer (152), or moves air across a heat sink or the flash memory device (224) itself to cool the flash memory device (224) and one or more of the flash memory modules (226, 228, 230) contained therein. Another example of an additional computing component is a computer processor (156) that generates heat during operation, such that the heat generated by the computer processor thermally impacts the flash memory device (224) and one or more of the flash memory modules (226, 228, 230) contained therein. Yet another example of an additional computing component is a DIMM that, because of its location relative to the flash memory device (224) and a fan, blocks the flow of air from the fan to the flash memory device (224) and one or more of the flash memory modules (226, 228, 230) contained therein.

Readers will appreciate that because certain flash memory modules (226, 228, 230) may be closer to heat generating sources such a computer processor, certain flash memory modules (226, 228, 230) may be exposed to more externally generated heat than other flash memory modules (226, 228, 230). Readers will similarly appreciate that because certain flash memory modules (226, 228, 230) may be closer to heat removing sources such a computer fan, certain flash memory modules (226, 228, 230) may have heat removed more efficiently than other flash memory modules (226, 228, 230). As such, each flash memory module (226, 228, 230) may be thermally impacted by its physical surroundings in a different manner.

The computer depicted in FIG. 1 carries out thermally sensitive wear leveling for a flash memory device (224) in accordance with the present invention by identifying a thermal sensitivity coefficient for each flash memory module (226, 228, 230), identifying wear leveling information for each flash memory module (226, 228, 230), receiving a request to write data to the flash memory device (224), selecting a target flash memory module (226, 228, 230) for servicing the request to write data to the flash memory device (224) in dependence upon the thermal sensitivity coefficient for each flash memory module (226, 228, 230) and the wear leveling information for each flash memory module (226, 228, 230), and writing the data to the target flash memory module (224), as described in greater detail below.

The computer (152) of FIG. 1 also includes at least one computer processor (156) or 'CPU' as well as random access memory (168) ('RAM') which is connected through a high speed memory bus (166) and bus adapter (158) to processor (156) and to other components of the computer (152). Stored in RAM (168) is an operating system (154). Operating systems useful for thermally sensitive wear leveling for a flash memory device (224) that includes a plurality of flash memory modules (226, 228, 230) according to embodiments of the present invention include UNIX™, Linux™, Microsoft XP™, AIX™, IBM's i5/OS™, and others as will occur to those of skill in the art. The operating system (154) is shown in RAM (168) but readers will appreciate that such software may alternatively be stored in non-volatile memory such as, for example, on a disk drive (170) or on the flash memory device (224).

The computer (152) of FIG. 1 includes disk drive adapter (172) coupled through expansion bus (160) and bus adapter (158) to processor (156) and other components of the computer (152). Disk drive adapter (172) connects non-volatile data storage to the computer (152) in the form of disk drive (170). Disk drive adapters useful in computers for thermally sensitive wear leveling for a flash memory device (224) that includes a plurality of flash memory modules (226, 228, 230) according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computer (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computer (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The example computer (152) of FIG. 1 includes a communications adapter (167) for data communications with other computers (182) and for data communications with a data communications network (100). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful for thermally sensitive wear leveling for a flash memory device that includes a plurality of flash memory modules according to embodiments of the present invention include modems for wired dial-up communications, Ethernet (IEEE 802.3) adapters for wired data communications network communications, and 802.11 adapters for wireless data communications network communications.

Figure 2:
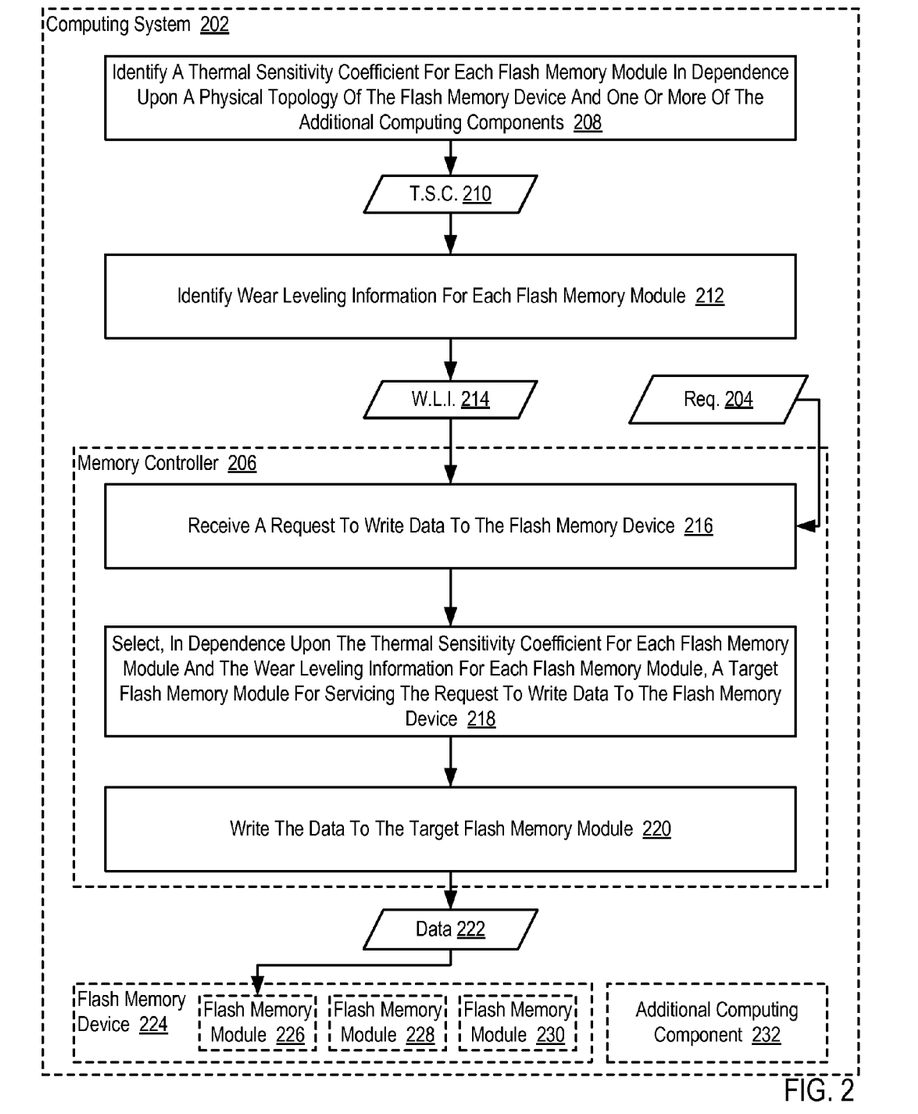
FIG. 2 sets forth a flow chart illustrating an example method for thermally sensitive wear leveling for a flash memory device that includes a plurality of flash memory modules according to embodiments of the present invention.

For further explanation, FIG. 2 sets forth a flow chart illustrating an example method for thermally sensitive wear leveling for a flash memory device (224) that includes a plurality of flash memory modules (226, 228, 230) according to embodiments of the present invention. The flash memory device (224) depicted in FIG. 2 is a form of computer storage that utilizes flash-based memory to form non-volatile computer storage. The flash memory device (224) may be embodied, for example, as a flash DIMM where flash-based memory is packaged onto a DIMM form factor that is inserted into a DIMM slot, as PCIe flash where flash-based memory is packaged onto a PCIe expansion card form factor that is inserted into a PCIe slot, and so on. Such flash memory devices (224) may therefore provide non-volatile memory to the computing system (202) in form factors that are distinct from traditional forms of non-volatile memory such as a traditional hard disk drive.

The flash memory device (224) depicted in FIG. 2 includes a plurality of flash memory modules (226, 228, 230). Each flash memory modules (226, 228, 230) may be embodied, for example, as a flash chip. Each flash memory module (226, 228, 230) may be arrayed to achieve a total capacity for the flash memory device (224) that is equal to the sum of the memory capacity for each of the flash memory modules (226, 228, 230).

The flash memory device (224) depicted in FIG. 2 is included in a computing system (202). The computing system (202) depicted in FIG. 2 includes a plurality of additional computing components (232). The additional computing components (232) of interest may include any computing component that thermally impacts the flash memory device (224) and the flash memory modules (226, 228, 230) contained therein. One example of an additional computing component (232) is a fan that draws cooler air into the case of the computing system (202) from outside the case, expels warm air from inside the case of the computing system (202), or moves air across a heat sink the flash memory device (224) itself to cool the flash memory device (224) and one or more of the flash memory modules (226, 228, 230) contained therein. Another example of an additional computing component (232) is a computer processor that generates heat during operation, such that the heat generated by the computer processor thermally impacts the flash memory device (224) and one or more of the flash memory modules (226, 228, 230) contained therein. Yet another example of an additional computing component (232) is a DIMM that, because of its location relative to the flash memory device (224) and a fan, blocks the flow of air from the fan to the flash memory device (224) and one or more of the flash memory modules (226, 228, 230) contained therein.

Readers will appreciate that because certain flash memory modules (226, 228, 230) may be closer to heat generating sources such a computer processor, certain flash memory modules (226, 228, 230) may be exposed to more externally generated heat than other flash memory modules (226, 228, 230). Readers will similarly appreciate that because certain flash memory modules (226, 228, 230) may be closer to heat removing sources such a computer fan, certain flash memory modules (226, 228, 230) may have heat removed more efficiently than other flash memory modules (226, 228, 230). As such, each flash memory module (226, 228, 230) may be thermally impacted by its physical surroundings in a different manner.

The example method depicted in FIG. 2 includes identifying (208) a thermal sensitivity coefficient (210) for each flash memory module (226, 228, 230). The thermal sensitivity coefficient (210) for a particular flash memory module (226, 228, 230) represents the extent to which a particular flash memory module (226, 228, 230) may be thermally impacted by one or more of the additional computing components (232) in the computing system. The thermal sensitivity coefficient (210) may therefore be embodied as a relative value where, for example, the thermal sensitivity coefficient (210) associated with a first flash memory module (226) is larger in value than the thermal sensitivity coefficient (210) associated with a second flash memory module (228) when the one or more of the additional computing components (232) expose the first flash memory module (226) to more heat (or less heat removal) than the second flash memory module (228). For example, the flash memory module (226, 228, 230) that is closest to a particular heat generating computer processor may have the highest thermal sensitivity coefficient (210) while the flash memory module (226, 228, 230) that is furthest away from the heat generating computer processor may have the lowest thermal sensitivity coefficient (210). In an alternative and non-exclusive example, the flash memory module (226, 228, 230) that is furthest away from a computer fan may have the highest thermal sensitivity coefficient (210) while the flash memory module (226, 228, 230) that is closest to the computer fan may have the lowest thermal sensitivity coefficient (210). While the examples included above describe a higher thermal sensitivity coefficient (210) as being associated with the flash memory module (226, 228, 230) that is most negatively thermally impacted by the one or more of the additional computing components (232), such an embodiment is only included for explanation and does represent a limitation of the present invention.

In the example depicted in FIG. 2, the thermal sensitivity coefficient (210) for a particular flash memory module (226, 228, 230) is identified (208) in dependence upon a physical topology of the flash memory device (224) and one or more of the additional computing components (232). The physical topology of the flash memory device (224) and one or more of the additional computing components (232) may include, for example, the distance between each flash memory module (226, 228, 230) on the flash memory device (224) and one or more of the additional computing components (232), the orientation of each flash memory module (226, 228, 230) on the flash memory device (224) and one or more of the additional computing components (232), and so on.

In the example method depicted in FIG. 2, identifying (208) a thermal sensitivity coefficient (210) for each flash memory module (226, 228, 230) may be carried out, for example, by providing a user interface to a system administrator and receiving a thermal sensitivity coefficient (210) for each flash memory module (226, 228, 230) from the system administrator via the user interface, by examining a specification of a board layout and determining the relative distance between a thermally beneficial computing component (e.g., a computer fan) and each flash memory module (226, 228, 230), by examining a specification of a board layout and determining the relative distance between a thermally detrimental computing component (e.g., a computer processor) and each flash memory module (226, 228, 230), by receiving a thermal sensitivity coefficient (210) for each flash memory module (226, 228, 230) as part of a specification of a board layout, and so on.

The example method depicted in FIG. 2 also includes identifying (212) wear leveling information (214) for each flash memory module (226, 228, 230). The wear leveling information (214) for each flash memory module (226, 228, 230) may include information identifying the extent to which a particular flash memory module (226, 228, 230) has been utilized. Such wear leveling information (214) can include, for example, the total number of times that data has been written to a particular flash memory module (226, 228, 230). Identifying (212) wear leveling information (214) for each flash memory module (226, 228, 230) may therefore be carried out by tracking the number of times that a particular flash memory module (226, 228, 230) has been written to, by requesting, from a system management module or other administrator, information describing the number of times that a particular flash memory module (226, 228, 230) has been written to, and so on. In the example method depicted in FIG. 2, the wear leveling information (214) may be utilized to facilitate 'wear leveling' of the flash memory modules (226, 228, 230) of the flash memory device (224).

Wear leveling of the flash memory modules (226, 228, 230) of the flash memory device (224) is carried out by equally, at least within a predetermined tolerance, distributing write accesses to flash memory modules (226, 228, 230) of the flash memory device (224). Wear leveling is important in view of the fact that memory cells and memory blocks becomes worn out and unreliable the more frequently that data is written to the memory cells and the memory blocks. As such, if the memory controller (206) operated by writing data to one flash memory module (226) in the flash memory device (224) much more frequently than another flash memory module (230) of the flash memory device (224), the flash memory module (226) that is written to more frequently would become worn out and unreliable while other flash memory modules (228, 230) in the flash memory device (224) that are written to less frequently would still function properly. In order to avoid prematurely wearing out certain flash memory modules (226, 228, 230) of the flash memory device (224) while simultaneously underutilizing properly functioning flash memory modules (226, 228, 230) of the flash memory device (224), a predictive failure algorithm may be utilized to intelligently distribute write accesses in a relatively uniform manner across all flash memory modules (226, 228, 230) of the flash memory device (224), such that each flash memory module (226, 228, 230) of the flash memory device (224) wears out in a relatively uniform manner. The wear leveling information (214) may therefore be utilized to steer new write access requests to those flash memory modules (226, 228, 230) that have been written to less frequently.

The example method depicted in FIG. 2 also includes receiving (216) a request (204) to write data to the flash memory device (224). In the example method depicted in FIG. 2, the request (204) to write data to the flash memory device (224) may be received by the memory controller (206). Such a request (204) may be generated by a computer processor or other form of computer logic and may include, for example, the size of data to be written to the flash memory device (224), the actual data that is to be written to the flash memory device (224), and so on.

The example method depicted in FIG. 2 also includes selecting (218), in dependence upon the thermal sensitivity coefficient (210) for each flash memory module (226, 228, 230) and the wear leveling information (214) for each flash memory module (226, 228, 230), a target flash memory module (226, 228, 230) for servicing the request (204) to write data to the flash memory device (224). In the example method depicted in FIG. 2, the target flash memory module (226, 228, 230) for servicing the request (204) to write data to the flash memory device (224) represents the flash memory module (226, 228, 230) that data will be written to in response to the request (204). Such a target flash memory module (226, 228, 230) will not only be selected (218) by taking into account the wear leveling information (214) for each flash memory module (226, 228, 230), but such a target flash memory module (226, 228, 230) will be selected (218) by also taking into account the thermal sensitivity coefficient (210) for each flash memory module (226, 228, 230), so as to write data to the flash memory module (226, 228, 230) in a thermally cognizant manner.

As described above, a predictive failure algorithm may carry out wear leveling of the flash memory device (224) by taking into account the number of times that a particular flash memory module (226, 228, 230) has been written to when determining which location in the flash memory device (224) that data should be written to in response to the memory controller (206) receiving a request (204) to write data to the flash memory device (224). The predictive failure algorithm may also take into account the extent to which a particular flash memory module (226, 228, 230) is thermally impacted by additional computing components (232) in the computing system (202) when determining which location in the flash memory device (224) data should be written to in response to the memory controller (206) receiving a request (204) to write data to the flash memory device (224).

Consider an example in which the thermal sensitivity coefficient (210) for each flash memory module (226, 228, 230) is determined based on the proximity of each flash memory module (226, 228, 230) to a heat generating computer processor. In such an example, the predictive failure algorithm may be structured such that during periods of time in which the computer processor is executing a large number of instructions (and thereby generating a large amount of heat), flash memory modules (226, 228, 230) whose thermal sensitivity coefficients (210) indicate that the flash memory modules (226, 228, 230) are furthest away from the computer processor are targeted for servicing write access requests. The predictive failure algorithm may be similarly structured such that during periods of time in which the computer processor is executing a small number of instructions (and thereby not generating a large amount of heat), flash memory modules (226, 228, 230) whose thermal sensitivity coefficients (210) indicate that the flash memory modules (226, 228, 230) are closest to the computer processor are targeted for servicing write access requests. In such a way, flash memory modules (226, 228, 230) that are more sensitive to heat produced by the computer processor are utilized when the computer processor is not generating much heat while flash memory modules (226, 228, 230) that are less sensitive to heat produced by the computer processor are utilized when the computer processor is generating larger amounts of heat.

For further explanation, consider an additional example in which the thermal sensitivity coefficients (210) for each flash memory module (226, 228, 230) are identified based on the proximity of each flash memory module (226, 228, 230) to a computer fan. In such an example, the predictive failure algorithm may be structured such that during periods of time in which a large number of write access requests are being serviced by the flash memory device (224) (thereby causing the flash memory device to generate a relatively large amount of heat), flash memory modules (226, 228, 230) whose thermal sensitivity coefficients (210) indicate that the flash memory modules (226, 228, 230) are closest to computer fans are targeted for servicing write access requests. The predictive failure algorithm may be similarly structured such that during periods of time in which a smaller number of write access requests are being serviced by the flash memory device (224) (thereby causing the flash memory device to generate a relatively small amount of heat), the flash memory modules (226, 228, 230) whose thermal sensitivity coefficients (210) indicate that the flash memory modules (226, 228, 230) are furthest from the computer fans may be targeted for servicing write access requests. In such a way, flash memory modules (226, 228, 230) that are more efficiently cooled by the computer fan are utilized when the flash memory modules (226, 228, 230) are generating larger amounts of heat while flash memory modules (226, 228, 230) that are less efficiently cooled by the computer fan are utilized when the flash memory modules (226, 228, 230) are generating smaller amounts of heat.

In the example method depicted in FIG. 2, selecting (218) a target flash memory module (226, 228, 230) for servicing the request (204) to write data to the flash memory device (224) may be carried out by applying a predictive failure algorithm that utilizes both wear leveling information (214) for each flash memory module (226, 228, 230) and the thermal sensitivity coefficient (210) for each flash memory module (226, 228, 230) as inputs. Consider, an as example of such a predictive failure algorithm, a predictive failure algorithm that generates a score for each flash memory module (226, 228, 230) as follows:

$$Score=TW+(TC*WA),$$

where TW is equal to the total number of write accesses previously serviced by a particular flash memory module (226, 228, 230), TC is the thermal sensitivity coefficient (210) for a particular flash memory module (226, 228, 230), and WA is the number of write accesses directed to the flash memory device (224) during a predetermined period of time. In such an example, assume that the flash memory module (226, 228, 230) associated with the lowest score will be selected (218) to service the request (204) to write data to the flash memory device (224). Further assume that a low thermal sensitivity coefficient (210) means that a particular memory module (226, 228, 230) is less affected by heat generated by other computing components.

By utilizing the predictive failure algorithm included above, a flash memory module (226, 228, 230) that has previously serviced a relatively high number of write accesses will have one component (TW) of the predictive failure algorithm driving its score higher than a flash memory module (226, 228, 230) that has previously serviced a relatively low number of write accesses, thereby promoting wear leveling. In addition, during periods where the number of write accesses that are directed to the flash memory device (214) is relatively large, the score for a flash memory module (226, 228, 230) with a relatively high thermal sensitivity coefficient (210) is more heavily impacted than would occur during periods where the number of write accesses that are directed to the flash memory device (214) is relatively small, thereby making it less likely that a flash memory module (226, 228, 230) with a relatively high thermal sensitivity coefficient (210) would be selected for servicing a write access during periods of heavy activity where the flash memory device (210) is exposed to large amounts of heat.

Consider an example in which a first flash memory module (226) has previously serviced 11,000 write accesses and a second memory flash module (228) has previously serviced 10,000 write accesses. Assume in such an example that the first flash memory module (226) is not very sensitive to heat generated by other computing components and therefore has a thermal sensitivity coefficient (210) of 0.1, while the second flash memory module (228) is very sensitive to heat generated by other computing components and therefore has a thermal sensitivity coefficient (210) of 0.9. In a situation where the number of write accesses serviced by the flash memory device (224) is relatively low (e.g., 5 write accesses in the immediately preceding predetermined period of time), the second flash memory module (228) will be selected by virtue of its low number of previously serviced write accesses and in spite of its relatively high sensitivity to heat generated by the other computing components. In a situation where the number of write accesses serviced by the flash memory device (224) is relatively high (e.g., 10,000 write accesses in the immediately preceding predetermined period of time), however, the first flash memory module (226) will be selected by virtue of its relatively low sensitivity to heat generated by the other computing components and in spite of its higher number of previously serviced write accesses. Readers will appreciate that in the example described above, less thermally sensitive flash memory modules will be more heavily utilized during periods of high activity, while during periods of low activity wear leveling considerations will control. Readers will further appreciate that as a discrepancy in the number of write accesses increases between two flash memory modules, however, the less utilized flash memory module will eventually be more heavily utilized.

The example method depicted in FIG. 2 also includes writing (220) the data (222) to the target flash memory module (224). In the example method depicted in FIG. 2, writing (220) the data (222) to the target flash memory module (224) may be carried out by writing data associated with the request (204) to a location with the flash memory module (224) selected (218) for servicing the request (204) to write data to the flash memory device (224).

Readers will appreciate that the steps described above may be carried out by a system management module, a memory controller, or any combination thereof. In fact, the steps described above may be carried out by computer software executing on computer hardware in the computing system (202), by special purpose computer logic such as a circuit, controller, field-programmable gate array ('FPGA'), or other form of computer logic included in the computing system (202), or by any combination thereof.

Figure 3:
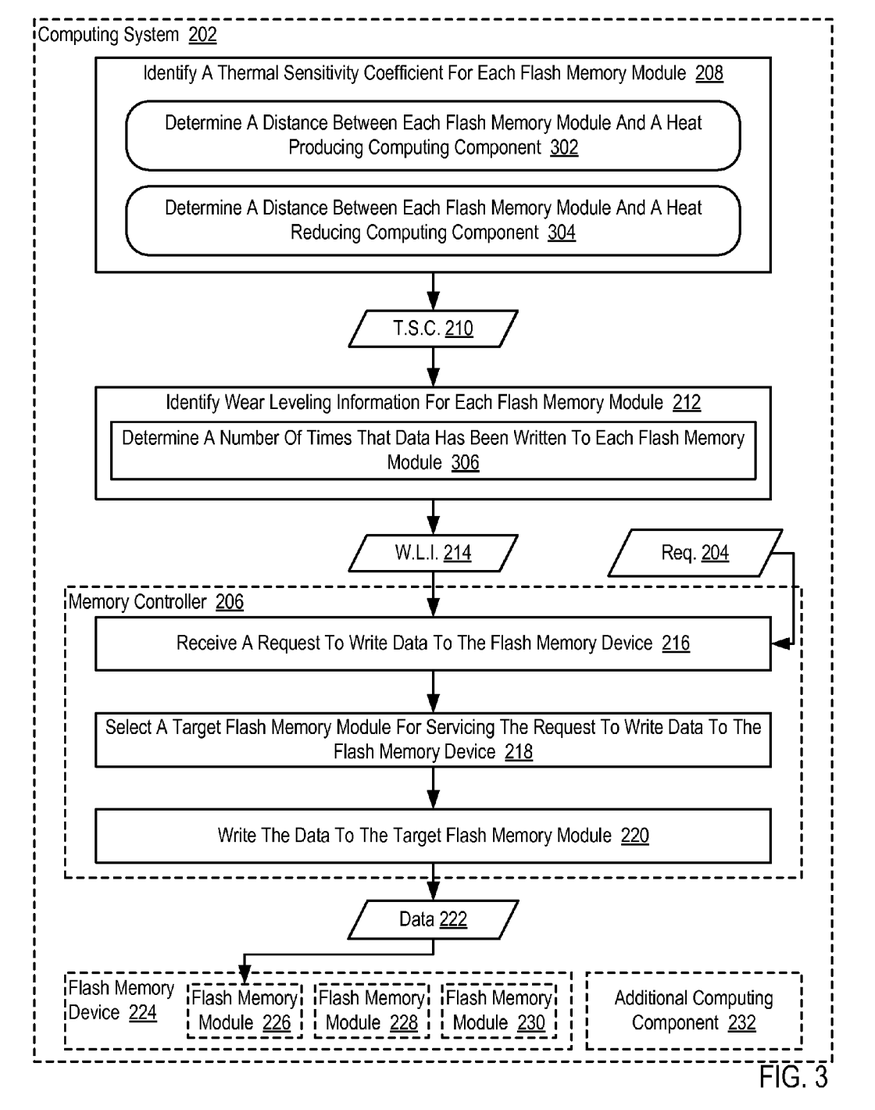
FIG. 3 sets forth a flow chart illustrating an additional example method for thermally sensitive wear leveling for a flash memory device that includes a plurality of flash memory modules according to embodiments of the present invention.

For further explanation, FIG. 3 sets forth a flow chart illustrating an additional example method for thermally sensitive wear leveling for a flash memory device (224) that includes a plurality of flash memory modules (226, 228, 230) according to embodiments of the present invention. The example method depicted in FIG. 3 is similar to the example method depicted in FIG. 2, as the example method depicted in FIG. 3 also includes identifying (208) a thermal sensitivity coefficient (210) for each flash memory module (226, 228, 230), identifying (212) wear leveling information (214) for each flash memory module (226, 228, 230), receiving (216) a request (204) to write data to the flash memory device (224), selecting (218) a target flash memory module (226, 228, 230) for servicing the request (204) to write data to the flash memory device (224), and writing (220) the data (222) to the target flash memory module (224).

In the example method depicted in FIG. 3, identifying (208) a thermal sensitivity coefficient (210) for each flash memory module (226, 228, 230) can include determining (302) a distance between each flash memory module (226, 228, 230) and a heat producing computing component. Examples of heat producing computing components can include processors, controllers, logic devices, busses, or any other mechanical component in a computing system that can produce heat during its operation. The distance between each flash memory module (226, 228, 230) and a heat producing computing component may be expressed in absolute terms such as, for example, a number of millimeters between each flash memory module (226, 228, 230) and the heat producing computing component. The distance between each flash memory module (226, 228, 230) and a heat producing computing component may alternatively be expressed in relative terms such as a ranking of each flash memory module (226, 228, 230) as being closest, second closest, third closest, and so on to a heat producing computing component. In the example method depicted in FIG. 3, determining (302) a distance between each flash memory module (226, 228, 230) and a heat producing computing component may be carried out, for example, by receiving such information from a system administrator, by extracting such information from a specification of a board design, and so on.

In the example method depicted in FIG. 3, identifying (208) a thermal sensitivity coefficient (210) for each flash memory module (226, 228, 230) can alternatively include determining (304) a distance between each flash memory module (226, 228, 230) and a heat reducing computing component. Examples of heat reducing computing components can include computer fans, heat sinks, or any other mechanical component in a computing system that can remove heat from the computing system during its operation. The distance between each flash memory module (226, 228, 230) and a heat reducing computing component may be expressed in absolute terms such as, for example, a number of millimeters between each flash memory module (226, 228, 230) and the heat reducing computing component. The distance between each flash memory module (226, 228, 230) and a heat reducing computing component may alternatively be expressed in relative terms such as a ranking of each flash memory module (226, 228, 230) as being closest, second closest, third closest, and so on to a heat reducing computing component. In the example method depicted in FIG. 3, identifying (304) a physical proximity of each flash memory module (226, 228, 230) to a heat reducing computing component may be carried out, for example, by receiving such information from a system administrator, by extracting such information from a specification of a board design, and so on.

Although steps 302 and 304 are described above as being alternative embodiments, readers will appreciate that identifying (208) a thermal sensitivity coefficient (210) for each flash memory module (226, 228, 230) can include both determining (302) a distance between each flash memory module (226, 228, 230) and a heat producing computing component and determining (304) a distance between each flash memory module (226, 228, 230) and a heat reducing computing component. Furthermore, multiple heat producing computing components and multiple heat reducing computing components may be taken into account when identifying (208) a thermal sensitivity coefficient (210) for each flash memory module (226, 228, 230).

In the example method depicted in FIG. 3, identifying (212) wear leveling information (214) for each flash memory module (226, 228, 230) can include determining (306) a number of times that data has been written to each flash memory module (226, 228, 230). Determining (306) a number of times that data has been written to each flash memory module (226, 228, 230) may be carried out, for example, by maintaining a counter associated with each flash memory module (226, 228, 230), where the counter associated with a particular flash memory module (226, 228, 230) that is incremented each time data is written to the particular flash memory module (226, 228, 230).

Figure 4:
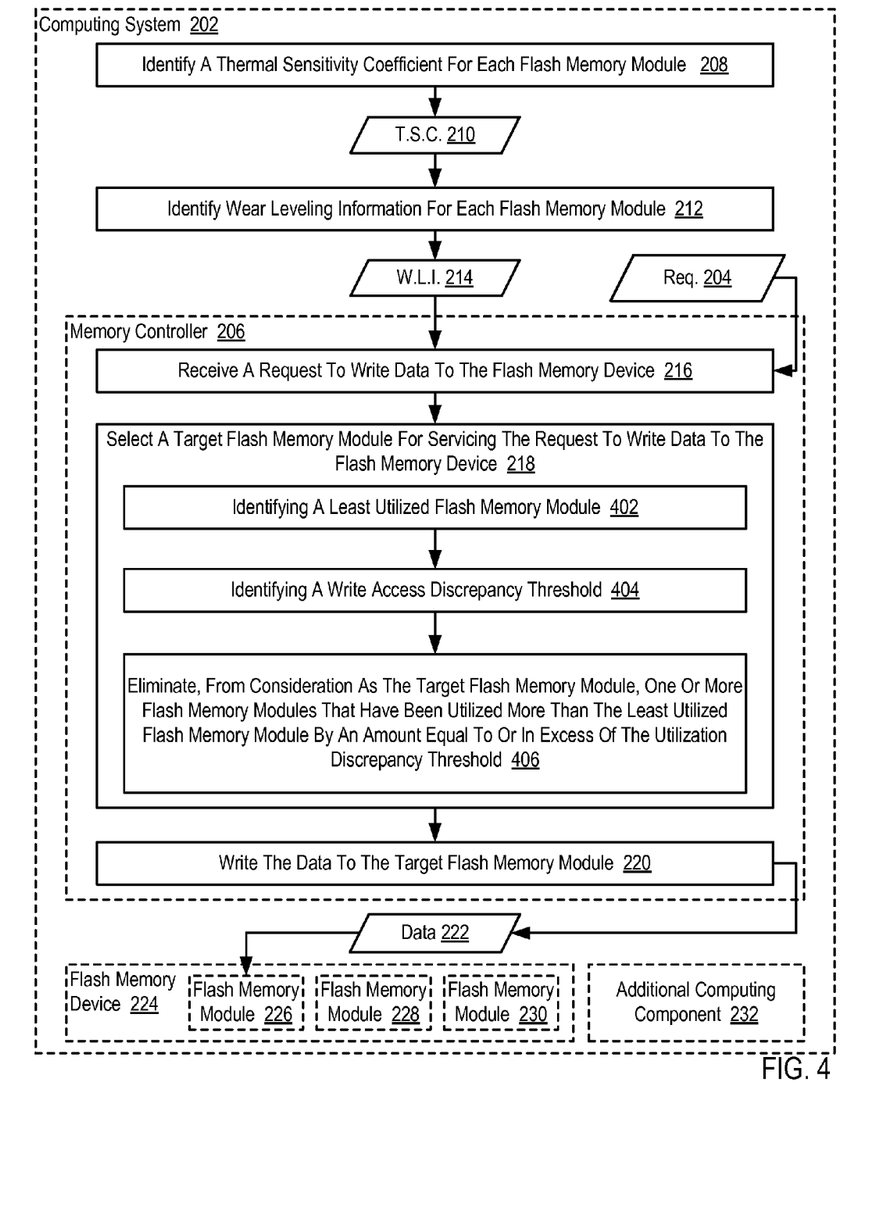
FIG. 4 sets forth a flow chart illustrating an additional example method for thermally sensitive wear leveling for a flash memory device that includes a plurality of flash memory modules according to embodiments of the present invention.

For further explanation, FIG. 4 sets forth a flow chart illustrating an additional example method for thermally sensitive wear leveling for a flash memory device (224) that includes a plurality of flash memory modules (226, 228, 230) according to embodiments of the present invention. The example method depicted in FIG. 4 is similar to the example method depicted in FIG. 2, as the example method depicted in FIG. 4 also includes identifying (208) a thermal sensitivity coefficient (210) for each flash memory module (226, 228, 230), identifying (212) wear leveling information (214) for each flash memory module (226, 228, 230), receiving (216) a request (204) to write data to the flash memory device (224), selecting (218) a target flash memory module (226, 228, 230) for servicing the request (204) to write data to the flash memory device (224), and writing (220) the data (222) to the target flash memory module (224).

In the example method depicted in FIG. 4, selecting (218) a target flash memory module (226, 228, 230) for servicing the request (204) to write data to the flash memory device (224) can include identifying (402) a least utilized flash memory module (226, 228, 230). The least utilized flash memory module (226, 228, 230) may be identified (402), for example, by identifying the flash memory module (226, 228, 230) that has serviced the least amount of write accesses. In such an example, identifying (402) the least utilized flash memory module (226, 228, 230) may therefore be carried out by comparing the number of times that data has been written to each flash memory module (226, 228, 230) and identifying the flash memory module (226, 228, 230) that has been written to the least amount of times.

In the example method depicted in FIG. 4, selecting (218) a target flash memory module (226, 228, 230) for servicing the request (204) to write data to the flash memory device (224) can also include identifying (404) a utilization discrepancy threshold. The utilization discrepancy threshold represents the extent to which one flash memory module (226, 228, 230) may be utilized more heavily than another flash memory module (226, 228, 230). The utilization discrepancy threshold may be specified, for example, as a numerical value specifying the amount of times that one flash memory module (226, 228, 230) may be written to more than another flash memory module (226, 228, 230). Identifying (404) a utilization discrepancy threshold may be carried out, for example, by receiving the utilization discrepancy threshold from a system administrator, by extracting the utilization discrepancy threshold from a system configuration file, and so on.

In the example method depicted in FIG. 4, selecting (218) a target flash memory module (226, 228, 230) for servicing the request (204) to write data to the flash memory device (224) can also include eliminating (406), from consideration as the target flash memory module, one or more flash memory modules (226, 228, 230) that have been utilized more than the least utilized flash memory module by an amount that is equal to or in excess of the utilization discrepancy threshold. Consider an example in which a first flash memory module (226) has serviced 11,000 write access requests and a second flash memory module (228) has serviced 10,000 write access requests, where the utilization discrepancy threshold is set to a value of 1000 writes. In such an example, the first flash memory module (226) would be eliminated (406) from consideration as the target flash memory module, such that a flash memory module (228, 230) other than the first flash memory module (226) would be selected (218) as the target flash memory module and thereby designated to service the request (204) to write data to the flash memory device (224). In such an example, the first flash memory module (226) would remain eliminated (406) from consideration as the target flash memory module until the number of write accesses serviced by the first flash memory module (226) exceeds the number of write accesses serviced by the least utilized flash memory module by a value that is less than the utilization discrepancy threshold.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of thermally sensitive wear leveling for a flash memory device that includes a plurality of flash memory modules, the flash memory device included in a computing system that includes a plurality of additional computing components, the method comprising:
    identifying a thermal sensitivity coefficient for each flash memory module in dependence upon a physical topology of the flash memory device and one or more of the additional computing components;
    identifying wear leveling information for each flash memory module;
    receiving a request to write data to the flash memory device;
    selecting, in dependence upon the thermal sensitivity coefficient for each flash memory module and the wear leveling information for each flash memory module, a target flash memory module for servicing the request to write data to the flash memory device; and
    writing the data to the target flash memory module.

2. The method of claim 1 wherein identifying a thermal sensitivity coefficient for each flash memory module in dependence upon a physical topology of the flash memory device and one or more of the additional computing components further comprises determining a distance between each flash memory module and a heat producing computing component.

3. The method of claim 1 wherein identifying a thermal sensitivity coefficient for each flash memory module in dependence upon a physical topology of the flash memory device and one or more of the additional computing components further comprises determining a distance between each flash memory module and a heat reducing computing component.

4. The method of claim 1 wherein identifying wear leveling information for each flash memory module further comprises determining a number of times that data has been written to each flash memory module.

5. The method of claim 1 wherein selecting, in dependence upon the thermal sensitivity coefficient for each flash memory module and the wear leveling information for each flash memory module, a target flash memory module for servicing the request to write data to the flash memory device further comprises:
    identifying a least utilized flash memory module;
    identifying a utilization discrepancy threshold; and
    eliminating, from consideration as the target flash memory module, one or more flash memory modules that have been utilized more than the least utilized flash memory module by an amount equal to or in excess of the utilization discrepancy threshold.

6. The method of claim 1 wherein the flash memory device is a flash dual in-line memory module (DIMM).

7. An apparatus for thermally sensitive wear leveling for a flash memory device that includes a plurality of flash memory modules, the apparatus including the flash memory device and a plurality of additional computing components, the apparatus further comprising a computer processor, a computer memory operatively coupled to the computer processor, the computer memory having disposed within it computer program instructions that, when executed by the computer processor, cause the apparatus to carry out the steps of:

identifying a thermal sensitivity coefficient for each flash memory module in dependence upon a physical topology of the flash memory device and one or more of the additional computing components;

identifying wear leveling information for each flash memory module;

receiving a request to write data to the flash memory device;

selecting, in dependence upon the thermal sensitivity coefficient for each flash memory module and the wear leveling information for each flash memory module, a target flash memory module for servicing the request to write data to the flash memory device; and     writing the data to the target flash memory module.

8. The apparatus of claim 7 wherein identifying a thermal sensitivity coefficient for each flash memory module in dependence upon a physical topology of the flash memory device and one or more of the additional computing components further comprises determining a distance between each flash memory module and a heat producing computing component.

9. The apparatus of claim 7 wherein identifying a thermal sensitivity coefficient for each flash memory module in dependence upon a physical topology of the flash memory device and one or more of the additional computing components further comprises determining a distance between each flash memory module and a heat reducing computing component.

10. The apparatus of claim 7 wherein identifying wear leveling information for each flash memory module further comprises determining a number of times that data has been written to each flash memory module.

11. The apparatus of claim 7 wherein selecting, in dependence upon the thermal sensitivity coefficient for each flash memory module and the wear leveling information for each flash memory module, a target flash memory module for servicing the request to write data to the flash memory device further comprises:

identifying a least utilized flash memory module;

identifying a utilization discrepancy threshold; and eliminating, from consideration as the target flash memory module, one or more flash memory modules that have been utilized more than the least utilized flash memory module by an amount equal to or in excess of the utilization discrepancy threshold.

12. The apparatus of claim 7 wherein the flash memory device is a flash dual in-line memory module ('DIMM').

13. A computer program product for thermally sensitive wear leveling for a flash memory device that includes a plurality of flash memory modules, the flash memory device included in a computing system that includes a plurality of additional computing components, the computer program product disposed upon a computer readable medium, the computer program product comprising computer program instructions that, when executed, cause a computer to carry out the steps of:

identifying a thermal sensitivity coefficient for each flash memory module in dependence upon a physical topology of the flash memory device and one or more of the additional computing components;

identifying wear leveling information for each flash memory module;

receiving a request to write data to the flash memory device;

selecting, in dependence upon the thermal sensitivity coefficient for each flash memory module and the wear leveling information for each flash memory module, a target flash memory module for servicing the request to write data to the flash memory device; and     writing the data to the target flash memory module.

14. The computer program product of claim 13 wherein identifying a thermal sensitivity coefficient for each flash memory module in dependence upon a physical topology of the flash memory device and one or more of the additional computing components further comprises determining a distance between each flash memory module and a heat producing computing component.

15. The computer program product of claim 13 wherein identifying a thermal sensitivity coefficient for each flash memory module in dependence upon a physical topology of the flash memory device and one or more of the additional computing components further comprises determining a distance between each flash memory module and a heat reducing computing component.

16. The computer program product of claim 13 wherein identifying wear leveling information for each flash memory module further comprises determining a number of times that data has been written to each flash memory module.

17. The computer program product of claim 13 wherein selecting, in dependence upon the thermal sensitivity coefficient for each flash memory module and the wear leveling information for each flash memory module, a target flash memory module for servicing the request to write data to the flash memory device further comprises:

identifying a least utilized flash memory module;

identifying a utilization discrepancy threshold; and eliminating, from consideration as the target flash memory module, one or more flash memory modules that have been utilized more than the least utilized flash memory module by an amount equal to or in excess of the utilization discrepancy threshold.

18. The computer program product of claim 13 wherein the flash memory device is a flash dual in-line memory module ('DIMM').

19. The computer program product of claim 13 wherein the computer readable medium comprises a signal medium.

20. The computer program product of claim 13 wherein the computer readable medium comprises a storage medium.

\* \* \* \* \*